US006624630B1

(12) United States Patent
Foxall

(10) Patent No.: US 6,624,630 B1
(45) Date of Patent: Sep. 23, 2003

(54) SLIDING FREQUENCY STEADY-STATE PRECESSION IMAGING

(75) Inventor: David L. Foxall, Mentor, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/989,818

(22) Filed: Nov. 20, 2001

(51) Int. Cl.[7] .................................................. G01V 3/00
(52) U.S. Cl. ...................................... 324/307; 324/309
(58) Field of Search ............................... 324/307, 309, 324/306, 300, 312, 314, 310

(56) References Cited

U.S. PATENT DOCUMENTS

| 5,170,122 A | * | 12/1992 | Bernstein ..................... 324/309 |
| 5,212,448 A | * | 5/1993 | Le Roux et al. ............ 324/309 |
| 6,310,478 B1 | | 10/2001 | Heid ........................... 324/309 |
| 6,452,387 B1 | * | 9/2002 | Hargreaves et al. ........ 324/300 |

FOREIGN PATENT DOCUMENTS

| EP | 526 065 | 2/1993 |
| EP | 571 071 | 11/1993 |

OTHER PUBLICATIONS

Vasanawala, et al., "Linear Combination Steady–State Free Precession MRI", Magnetic Resonance in Medicine 43:82–90 (2000).
NMR Imaging in Biomedicine, Mansfield, et al., "SSFP Analysis", pp. 68–83 ©Academic Press, NY 1982.
Stromski, et al., "Application of Missing Pulse Steady State Free Precession to the Study of Renal Microcirculation", Mag. Res. in Med. 20:66–77 (1991).
Schwenk, "NMR Pulse Technique with High Sensitivity for Slowly Relaxing Systems", J. Mag. Res. 5:376–389 (1971).
Vasanawala, et al., "Linear Combination Steady–State Free Precession MRI", Mag. Res. in Medicine 43:82–90 (2000).
"Fat Suppressed CBASS", 4 pp, Jun. 26, 2001.
Vasanawala, et al., "Fluctuating Equilibrium MRI", Mag. Res. in Medicine 42:876–883 (1999).
Duerk, et al., "Remember True FISP? A High SNR, Near 1–Second Imaging Method for T2–Like Contrast in Interventional MRI at .2 T" ISMRM 1998, pp. 203–208.
Bundy, et al., "Segmented TrueFISP Cine Imaging of the Heart", Proc. Intl. Soc. Magn. Reson. Med. 7 (1999) p 1282.
Bundy, et al., "Real–Time Data Acquisition for LV Function", Proc. Intl. Soc. Magn. Reson. Med. 7 (1999) p 386.

(List continued on next page.)

Primary Examiner—Louis Arana
(74) Attorney, Agent, or Firm—Fay, Sharpe, Fagan, Minnich & McKee, LLP

(57) ABSTRACT

A steady-state free precession (SSFP) sequence includes a large multiplicity of RF pulses (40) with a relatively short repeat time or interpulse interval (TR) on the order of 2–10 milliseconds. After applying the RF pulses for a period of about 3 $T_1$, about 6 seconds, a steady-state is achieved. Thereafter, at least a phase-encode gradient (42) and a read gradient (44) are applied between each subsequent pair of adjoining RF pulses, a data line being generated during each read gradient pulse. For a 128 line image with a TR of 6 milliseconds, a set of data lines are generated in 768 milliseconds, about ¾ of a second. As the data lines are generated, a spectral offset is adjusted by continuously adjusting an RF phase of an RF transmitter (24) and an RF receiver (50), with N sets of data lines being generated over 360° of RF phase shift. Like corresponding data lines from each set offset an RF phase by 360°/N are combined and Fourier transformed into an image representation. In this manner, N complete data sets are collected at different spectral offsets without intervening delay intervals to reestablish the steady-state, i.e., in 9 seconds instead of 27 seconds (for N=4).

29 Claims, 6 Drawing Sheets

OTHER PUBLICATIONS

Carr, et al., "Segmented TrueFISP—An Improved Technique for CINE MR Angiography".

Deimling, et al., "Magnetization Prepared True FISP Imaging" SMR 2nd Meeting, 1994, San Francisco, p. 495.

Liu, "CBASS Re–Implementation on Outlook+", Oct. 19, 1998, 17 pp.

Zur, et al., "An Analysis of Fast Imaging Sequences with Steady–State Transverse Magnetization Refocusing", Mag. Res. in Med. 6:175–193 (1988).

* cited by examiner

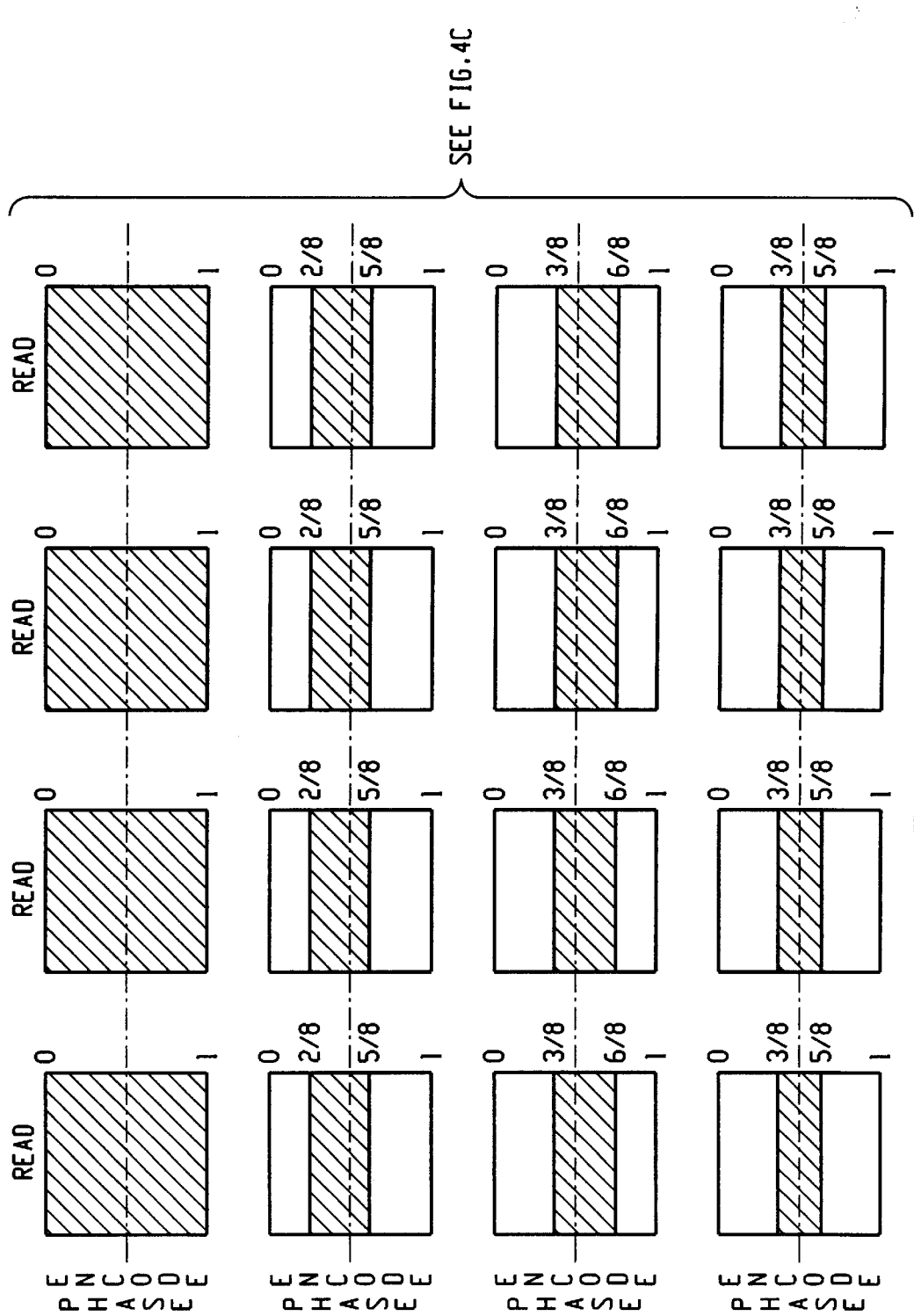

SLIDING FREQUENCY STEADY-STATE PRECESSION IMAGING

BACKGROUND OF THE INVENTION

The present invention relates to the magnetic resonance imaging arts and particularly to steady-state free precession (SSFP) imaging.

In steady-state free precession imaging, a series of magnetic resonance excitation pulses are applied at relatively short intervals, typically in the 2–15 millisecond range. After this series of pulses is applied for about three times the $T_1$ relaxation time (between one and six seconds for many common tissue types), the magnetic resonance is stabilized in a steady-state condition. Thereafter, following each magnetic resonance excitation pulse, a phase-encoding gradient and a read gradient are applied to read out one phase-encoded data line until a full set of data lines are collected. Conventional steady-state free precession imaging sequences take advantage of signal generation along the longitudinal axis or both the longitudinal axis and the transverse plane.

Area and moment balancing of gradient pulses which are applied in addition to frequency unwinding pulses which maintain coherence of the spin system rotating frame of reference have been used to increase image signal-to-noise ratios by making efficient use of the superposition of the rising and falling components of the resonance signal. Balanced gradient moments and short repetition times make steady-state free precession sequences insensitive to many types of patient motion and allow spins of flowing blood or cerebral fluid to come to a steady-state.

Strong tissue contrast is obtained on the basis of the $T_1$ and $T_2$ relaxation times and the tip angle. Low tip angle images have a $T_1$ or proton density weighted contrast. High tip angle images have a contrast that is more $T_2$ dependent. At the Ernst angle, the image contrast is relatively independent of the repetition time and becomes proportional to the ratio of $T_1$ and $T_2$ of the imaged tissue.

Completely balanced sequences possess significant disadvantages. The pulse train produces a spectrally varying periodic excitation pattern with a frequency period proportional to the reciprocal of the sequence repetition time. This excitation pattern has two distinct null points per period that result in image banding artifacts. In order to achieve a stable steady-state in both the longitudinal and transverse magnetization, the excitation pulses are applied for several $T_1$ before the signal is sampled. Often, the stabilization time is a significant fraction of the total imaging time, often more than half.

The periodic nature of the excitation pattern leads to banding artifacts that tend to follow the magnetic field contours in steady-state free precession images, because magnetic field inhomogeneity contributes to the local spectral offset in each imaging pixel. In general, the appearance of banding artifacts is governed by the total phase precession gained by spins during the interpulse (TR) period. Common sources of phase precession in liquid state imaging include: resonance offset, chemical shift, magnetic field inhomogeneity, spin coupling, unbalanced gradient pulses, and unbalanced changes in the transmitter carrier frequency and receiver demodulation frequency or their phases. An effective (average) spectral offset (radians/sec) can be defined for each spin species in any pixel by dividing its total phase gain between pulses (radians), by the interpulse spacing (seconds).

One proposed solution for banding artifacts is the use of very short repetition times to reduce the total phase gain from local changes in spectral offset. Another solution is to average a plurality of excitations or images with a range of spectral offsets such that the banding artifacts average out or cancel, because of the periodic nature of the steady-state spectral response. Both solutions, however, have drawbacks.

Ultra-short repetition times compact the time available for phase-encode and read gradients. As the times become shorter, the gradients need to turn on and off more quickly, i.e., a higher slew rate. Typically, higher strength gradients are used to offset the shorter read times. Such systems are expensive and may be unfavorable to patient safety and comfort. Rapidly changing magnetic fields can induce both muscular and neural stimulation. The use of strong gradients also requires the use of wide bandwidth receivers to digitize the read out resonance signals. Such wide bandwidth receivers decrease the signal-to-noise ratio counteracting a primary advantage of the steady-state free precession method. Further, short repetition times severely restrict image resolution.

Averaging spectral offset magnetic resonance signals or complex valued images created from such signals successfully cancels banding artifacts. The RF pulses in the steady-state free precession excitation train are shifted in constant phase increments, e.g., 90°, for each successive RF pulse. A similar phase shift is also applied to the signal detected in the imager's receiver. These combined phase shifts change the frequency of the rotating reference frame. Hence, a 90° phase increment moves the spectral excitation pattern by a frequency offset equal to ¼ of a period. A 180° phase increment shifts the pattern by ½ of a period, and so on. Collecting a set of data lines for each of a plurality of different phase cycles. with different phase increments spaced equally over any 360° period allows averaging to cancel the banding artifacts. Alternately, a Fourier transform applied across the spatially encoded data dimension can be used to average or combine the phase shifts. The collection of the steady-state free precession signal with a series of increment phase cycles is the equivalent to encoding the data with spectral offset in addition to the usual spatial encodings that are accomplished by the gradient pulses. Calculation of a mean or averaged signal is equivalent to the calculation of the central (k=0) Fourier coefficient for the spectral domain.

A primary drawback of the signal averaging or transform approach is that a large number of averages are collected to cancel the banding artifacts, typically at least four. Time is allocated for the system to regain its steady-state after each change of the phase cycle. This causes image data to be averaged in a serial fashion rather than in a sequential fashion. That is the four or other plural number of like data line sets with each of the averaged spectral offsets are collected at temporally different times rather than sequentially.

The present invention provides a new and improved steady-state free precession imaging technique that overcomes the above-referenced problems and others.

SUMMARY OF THE INVENTION

In accordance with one aspect of the present invention, an improvement is provided in steady-state free precession magnetic resonance imaging sequences in which a plurality of sets of data lines are collected with different spectral offsets. The improvement includes changing the spectral offset of the RF excitation as each data line is collected to modulate, but not destroy the steady-state response of the spin system.

In one aspect of the invention, the spectral offset is changed sufficiently slowly that steady-state condition can be reversibly modulated and anneal between the acquisition of each data line.

In accordance with another aspect of the present invention, the spectral offset is cycled repeatedly through a finite series of states to generate a periodically repeating cycle of spectrally shifted steady-state responses.

In accordance with another aspect of the present invention, a method of magnetic resonance imaging is provided. A region of interest of a subject to be imaged is placed in an examination region in a main magnetic field. Resonance is repeatedly excited with a RF pulse at regular intervals. After steady-state free precession has been established, RF pulses continue to be applied and at least phase encode and read gradients are applied following each RF pulse to generate a set of data lines in k-space. During the generation of the set of data lines, the phase of the RF excitation pulses is changed to modulate the spectral offset.

In accordance with another aspect of the present invention, an apparatus for generating magnetic resonance images is provided. A main magnet generates a main magnetic field through an examination region. An RF transmitter generates a plurality of RF pulses with a selected repeat time between pulses and a selected RF phase. The RF pulses induce magnetic resonance which, with repeated applications of the RF pulses at the common repeat time, establishes steady-state free precession. A receiver detects the magnetic resonance signals at intervals between adjacent RF pulses after steady-state free precession has been established and demodulates the magnetic resonance signal. The receiver also has an adjustable RF phase. A means adjusts the RF phase of the RF transmitter and the RF receiver concurrently and at least piecewise continuously.

In accordance with another aspect of the present invention, an improvement is provided in a steady-state free precession magnetic resonance imaging apparatus.

The improvement includes a means for changing the spectral offset sufficiently slowly that a plurality of the sets of data lines are collected without needing a steady-state to be reestablished between each set of collected data lines.

One advantage of the present invention is that it reduces data acquisition time.

Another advantage of the present invention is that it reduces or eliminates banding artifacts.

Another advantage of the present invention is that it is amenable to higher resolution imaging.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIG. 4B illustrates the regions of k-space that are collected in each cycle portion;

DETAILED DESCRIPTION OF THE PREFERRED EMBODIMENTS

Figure 1:
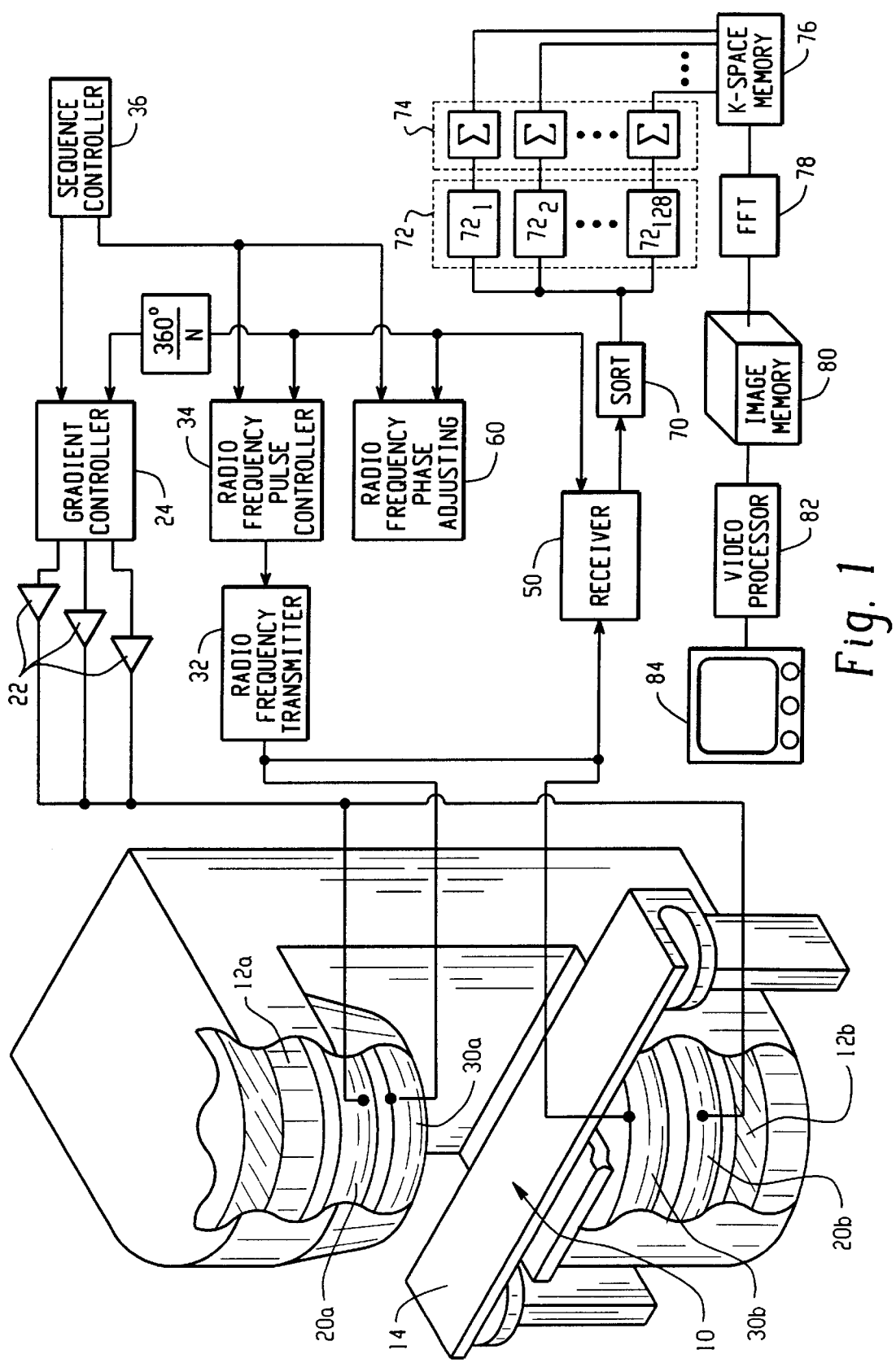
FIG. 1 is a diagrammatic illustration of a magnetic resonance imaging system in accordance with the present invention.

With reference to FIG. 1, the present invention is equally applicable to high field and low field systems. It is also applicable to both open or C-type magnets and cylindrical bore type magnets, although an open magnet is shown in FIG. 1 for purposes of illustration. An imaging region 10 is defined within a $B_0$ field generated by superconducting or resistive coils 12a, 12b of a main field magnet. The main field magnet generates a temporally constant, main magnetic field $B_0$ through the imaging region along a vertical axis, in the open magnet embodiment. A subject is supported in the imaging region by a patient support 14.

Gradient magnetic field windings or coils 20a, 20b of a gradient field coil set are disposed adjacent the imaging region 10 to create magnetic field gradients across the main magnetic field, along three orthogonal axes. The gradient coils are connected to gradient amplifiers 22 and a gradient magnetic field controller 24. In the illustrated open magnetic system, the gradient coils are mounted above and below the patient. In bore type systems, the gradient coils are traditionally mounted on a tube that surrounds the bore.

In order to excite magnetic resonance in selected dipoles of the subject disposed in the imaging region, windings or coils 30a and 30b of an RF coil are disposed between the subject and the gradient coils. Although whole body RF coils are illustrated, it is to be appreciated that head and other localized or specialized coils may also be utilized. At least one radio frequency transmitter 32, preferably a digital transmitter, causes the radio frequency coil to transmit radio frequency pulses with the amplitude, timing, and phase set by a radio frequency pulse controller 34 into the imaging region.

Figure 2:
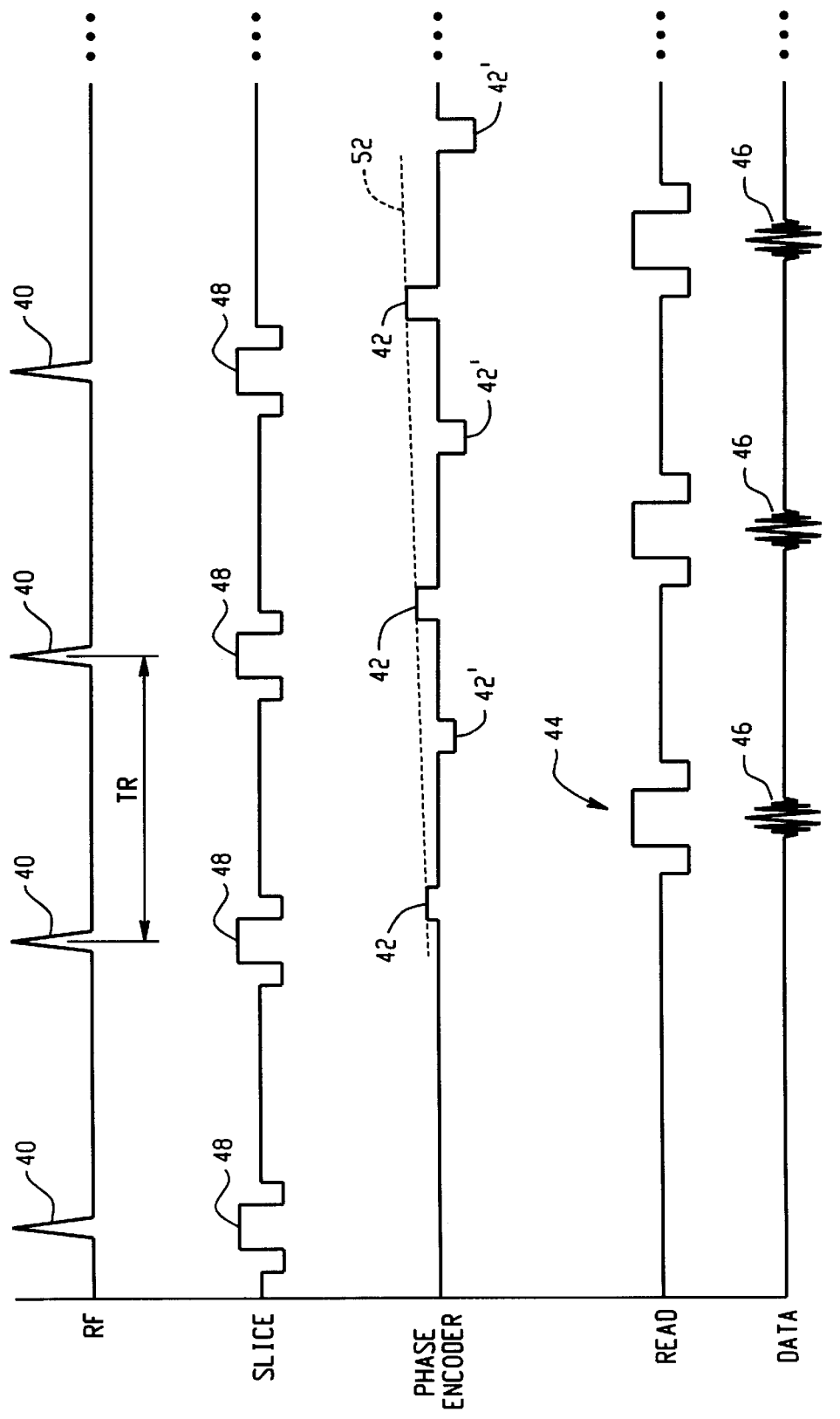
FIG. 2 is a diagrammatic illustration of a segment of a steady-state free precession imaging sequence.

With continuing reference to FIG. 1 and further reference to FIG. 2, a sequence controller 36 causes the gradient controller 24 and the RF controller 34 to implement a steady-state free precession technique. More specifically, a series of RF or radio frequency excitation pulses 40 are applied displaced by an interpulse time interval or repeat time TR. In the preferred embodiment, the repeat time is about 2–15 milliseconds. A train of RF pulses are applied to establish the steady state. Once the steady state is established, a phase-encode gradient 42 is applied to select a data line in k-space between each pair of RF pulses. A phase-encode rewind gradient 42' removes the phase-encoding after each data line is read. Also between each pair of pulses, a read gradient 44 is applied for frequency-encoding a resultant magnetic resonant echo 46. In one embodiment, a slice select pulse 48 is applied in conjunction with each RF pulse to limit the excitation to a preselected slice.

By varying the frequency of the slice select RF pulse by a means consistent with maintaining the coherence of the spin system rotating frame then the physical location of the excited slice may be stepped to generate multiple two-dimensional images covering any desired volume. The slice select frequency shift may be created for a constant transmitter carrier frequency by modulating the stored specification of the selective RF pulse in the transmitter waveform memory with an audio frequency equivalent to the frequency shift of the slice from the magnet center when the slice select gradient is applied. Alternatively, the slice select frequency shift may be created by shifting the transmitter carrier frequency during transmission of the RF pulse in a phase continuous fashion. The phase difference between transmitter and receiver channels must then be rewound when the transmitter is returned to the central magnetic resonance frequency after transmission of the RF pulse. Phase rewinding between the transmitter and receiver can be accomplished by setting the transmitter frequency in the opposite sense to that used for slice selection for an equivalent time interval to the duration of the RF pulse.

Alternately, a second phase-encode gradient can be applied along the "slice select" direction for three-dimensional data acquisition with two dimensions phase-encoded and one dimension frequency encoded.

The magnetic resonance signals 46 are picked up by the whole body RF coil 30a, 30b or a localized coil. (not shown), amplified, and demodulated by a receiver 50, preferably a digital receiver. The transmit and receive coils can be the same coil or different coils.

Initially, the RF pulses 40 can be applied, either with or without the imaging gradients to excite magnetic resonance repeatedly and bring the spin system of the subject into a steady-state. Typically, a time period of about three $T_1$ is sufficient to establish a steady-state. For body tissue with a $T_1$ of about 2,000 milliseconds, the RF pulses are applied for about 6,000 milliseconds, i.e., 6 seconds. With a repeat time TR of 6 milliseconds, 1,000 RF pulses are applied to establish steady-state.

Once steady-state has been achieved, the phase-encode gradient 42 and read gradient 44 are applied between each adjacent pair of RF pulses.

In the illustrated embodiment, the phase-encode gradient 46 is incremented in each repetition along a trajectory 52 to step through k-space. Although the trajectory 52 is shown as a continuum in FIG. 3, it is to be understood that it represents the amplitude change of the 128, 256, etc., phase-encode pulses that span k-space and not a continuous phase-encode gradient. When collecting an image with 128 lines in k-space, there are 128 repetitions of the RF pulse 40 between a beginning 54 and an end 56 of the phase-encode gradient trajectory 52. For a repeat time of 6 milliseconds, 128 data lines are collected in just under 800 milliseconds.

Once the steady-state has been established, an RF phase adjusting means or processor 60 adjusts the phase of the RF transmitter and receiver in coordination. The phase of the transmitter and the receiver are incremented just prior to transmission of each RF pulse and held constant through the rest of the interpulse interval. Although the trajectory 62 is shown as a continuum in FIG. 3, it is to be understood that it represents a series of phase increments that span a period of 360°. It is desirable to keep changes between successive phase increment steps less than about 4° so that the steady-state condition of the magnetization can reversibly anneal whilst the effective spectral offset is modulated.

Figure 3:
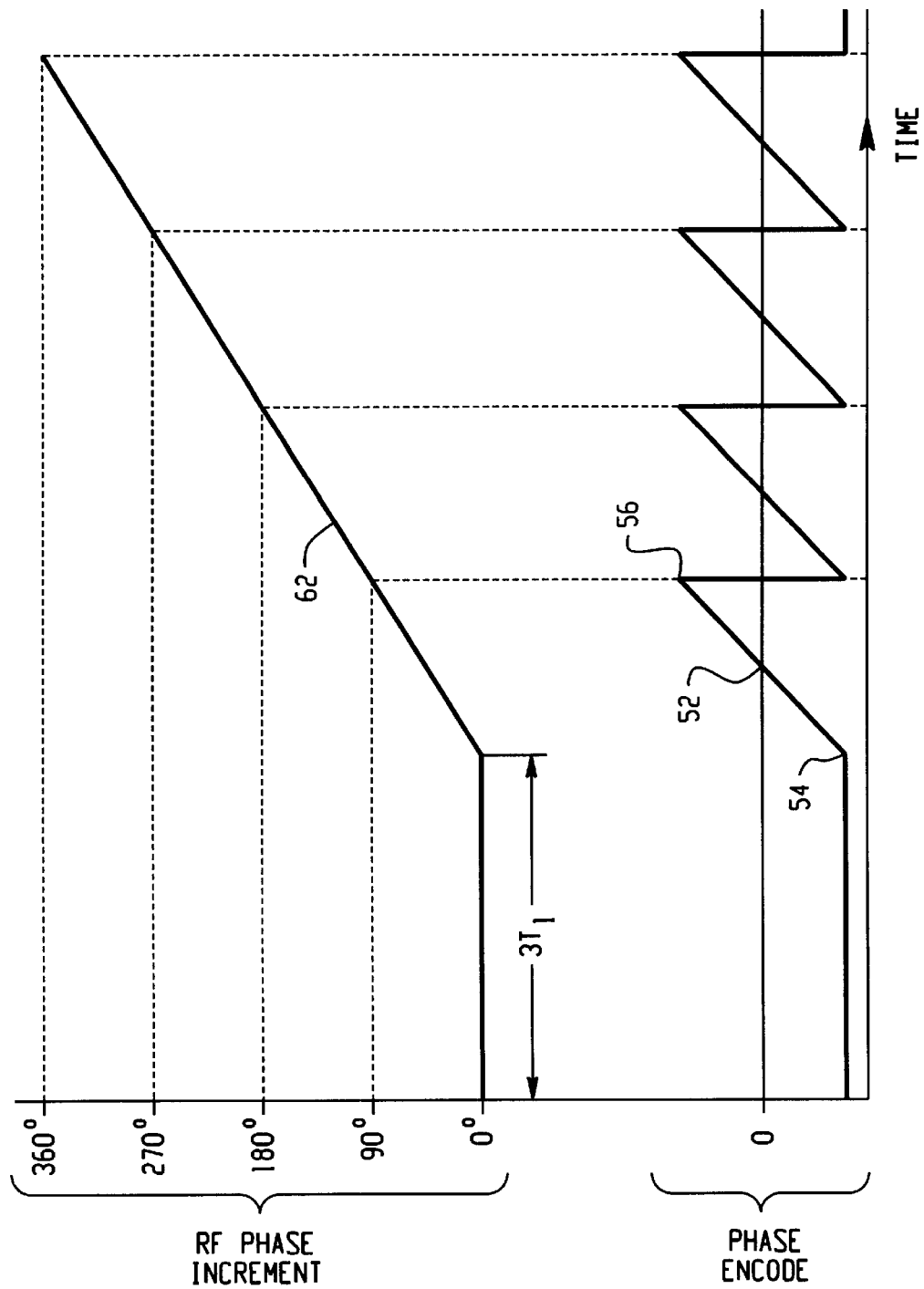
FIG. 3 illustrates timing of changes in the RF phase increment and the amplitude of the phase-encode gradient pulses.

The trajectory of the phase-encode gradient and a trajectory 62 of the RF phase are coordinated such that over the course of collecting one of N sets of data lines between points 54 and 56, the RF phase increment has shifted 360°/N, where N=4 in the embodiment illustrated in FIG. 3.

When a full set of data of k-space is collected, the phase-encode gradient magnitude is returned to the initial value and the process is repeated to generate a second set of data lines spanning k-space.

In an illustrated embodiment in which averaging takes place in k-space, a data line sorting means or processor 70 sorts the data lines among a series of memories 72 such that the first data line of each of the N sets is stored in a first memory $72_1$, the second line of each of the N sets is stored in a second line data memory $72_2$, and so on. Once N corresponding data lines have been collected, a summing or averaging processor 74 averages the like data lines which combined data lines are then loaded into a k-space memory 76. An inverse Fourier transform processor 78 Fourier transforms the k-space data to create an image representation which is stored in an image memory 80. Preferably, the image representation is a three-dimensional representation and can be generated either as a series of contiguous slices or by a three-dimensional Fourier transform. A video processor 82 accesses the image memory to generate slice, surface rendering, angiographic, or other images for display on a monitor 84.

Although the phase-encode magnitude is illustrated in FIG. 3 as being linear, i.e., that the lines of k-space are collected serially, it is to be appreciated that these data lines can be collected in other orders. Moreover, some of the lines of k-space can be collected more than once in each of the N segments of the imaging cycle. Further, the rate at which the spectral offset (RF phase increment) changes need not be linear. The change can plateau, or change more or less rapidly at various points in the data collection cycle. For example, the RF phase increment might change more quickly near the edges of k-space and more slowly during the collection of data lines near the center of k-space.

The embodiment shown in FIG. 3 cancels banding artifacts by combining the theoretical minimum number of complete data sets needed for this purpose (N=4). Such a set of data can be said to form a complete artifact cancellation set. Better cancellation of banding artifacts is obtained if the size of the cancellation set N is increased, because this provides better sampling over the spectral response of the steady-state signal. While this is a desirable improvement, it comes at the expense of scan time.

The cost of artifact cancellation can be reduced because it is unnecessary to combine complete data sets. Only subsets of the complete data near the center of k-space need be acquired if at least four full k-space memories have been filled to provide enough data for basic artifact cancellation in every line of k-space. Improved artifact cancellation can be obtained with fewer data lines, because band artifacts tend to be most strongly represented in the central data lines of k-space which contribute most to the overall image contrast and intensity, while the outer data lines of k-space contribute mainly edge definition and in large part the image noise.

Figure 4A:
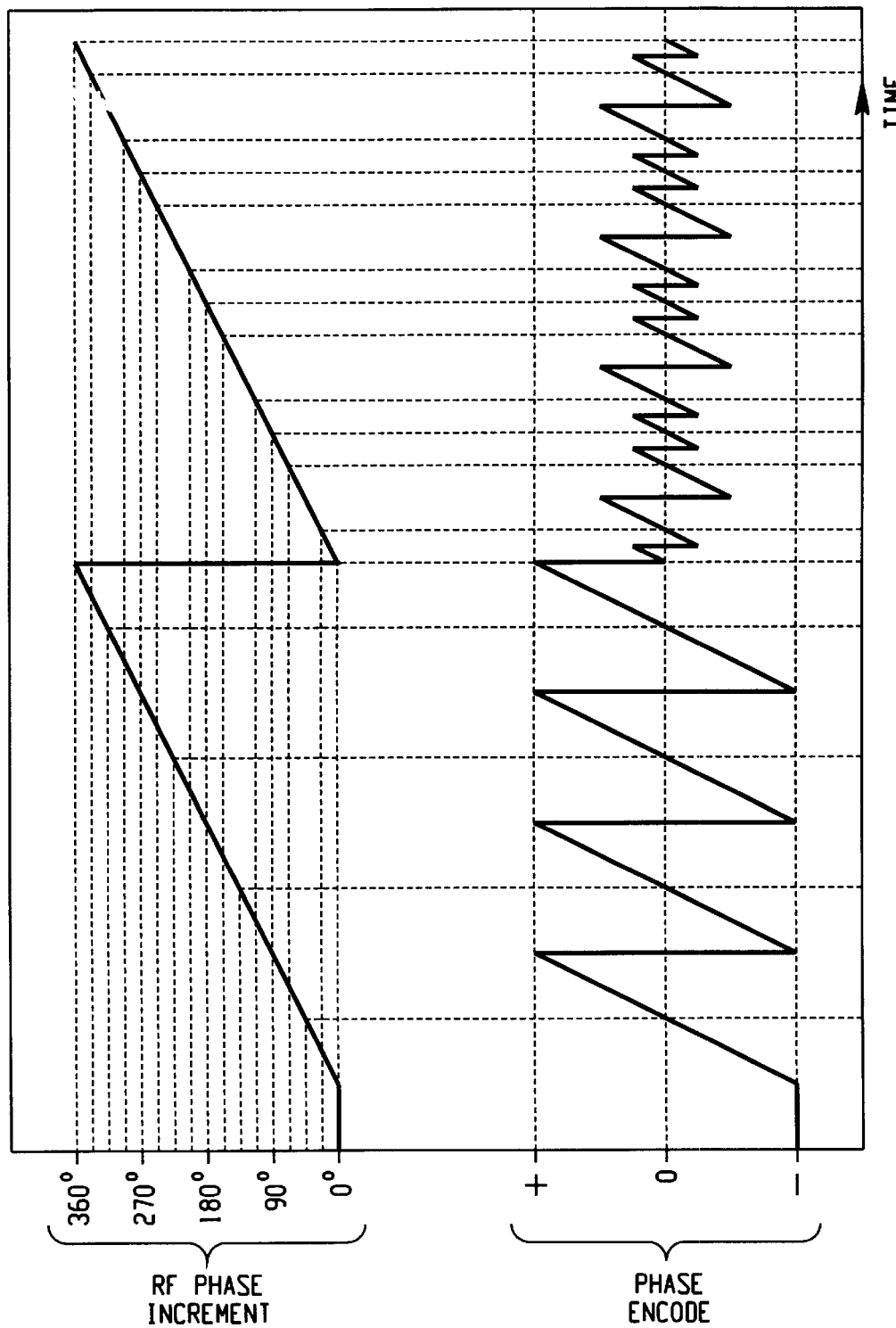
FIG. 4A illustrates timing of changes in the RF phase increment and the amplitude of the phase-encode gradient pulses with more data lines at the center of k-space being collected and averaged than adjacent edges of k-space.

One illustrated embodiment of the invention that takes advantage of these principles to provide a scan time saving equal to a factor of two is shown in FIG. 4A. Once steady-state has been established, the RF phase of the transmitter and receiver devices is incremented in steadily increasing steps from 0° to 360° and four full k-space data sets are acquired in the same fashion as is shown in FIG. 3. Once the RF phase increment reaches a value of 360°, a second period of RF phase incrementation can begin. While it might appear that there is an extreme discontinuity in the RF phase trajectory, in reality there is none, because of the equivalence of 0° and 360° phase shifts.

Figure 4C:
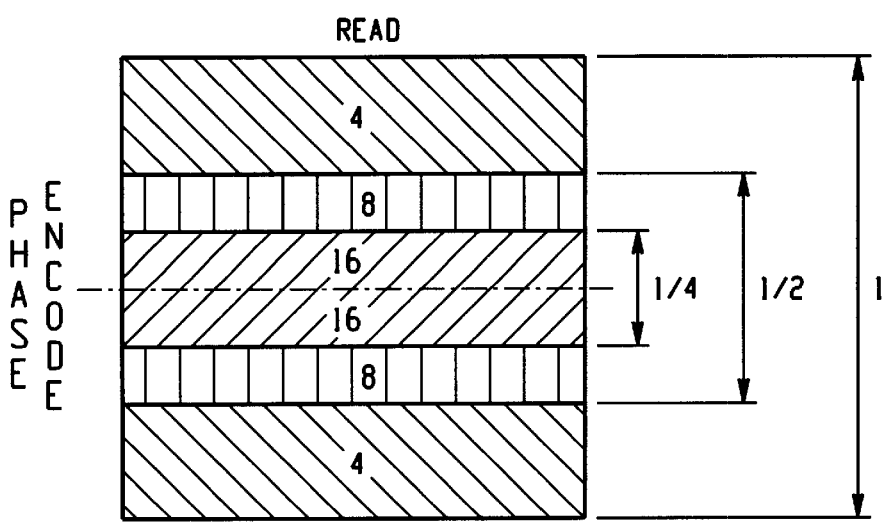
FIG. 4C illustrates the number of redundant data lines collected for various regions of k-space; and, FIG. 5 illustrates yet another embodiment in which each set of data lines spans about half of k-space.

During the second period of RF phase incrementation shown in FIG. 4A, twelve data sets covering the central region of k-space are acquired. The states of the data memories 72 are shown in FIG. 4B and their resultant combination after the averaging processor 74 is shown in FIG. 4C. The twelve central regions of k-space shown in FIG. 4B can be grouped into three subsets. The order in which the data lines in each subset are acquired relative to the RF phase trajectory (spectral offset) is chosen so that each subset forms a complete cancellation set for the region of k-space acquired.

For the embodiment shown in FIG. 4A, the first subset contains three eights of the data lines needed for a complete k-space data set, two thirds of these data lines are acquired before the k=0 point and one third of them after. The second subset also contains three eights of the data lines needed for a complete k-space data set, one third of these data lines are acquired before the k=0 point and two thirds of them after. The third subset contains the data lines in the central quarter of k-space. FIG. 4C shows the total number of data lines that contribute to various regions of k-space when all the data for the scan shown in FIG. 4A is combined. The central quarter of the combined k-space results from sixteen data lines, the two flanking regions each spanning one eighth of combined k-space results from the combination of eight data lines, and the two outer quarters of k-space result from the combination of four data lines. This unevenness in the combined data lines can be compensated for by applying a filter, the simplest of example which normalizes each data line in the combination by the number of individual data lines from which it is derived. The overall result of the acquisition is an image which is substantially equivalent in quality to that obtained using N=16 with the embodiment shown in FIG. 3, but acquired in half the time. It is to be appreciated that the number of data sets used in the cancellation subsets N, the size and extent of the central regions of k-space, their ordering with respect to the RF phase increment scheme, and the RF phase increment scheme used in the embodiment illustrated in FIG. 4A are merely selectable properties of a particular scan, or scanning scheme, and that many different variations of this particular embodiment with different tradeoffs between scan time and scan quality are possible.

Figure 5:
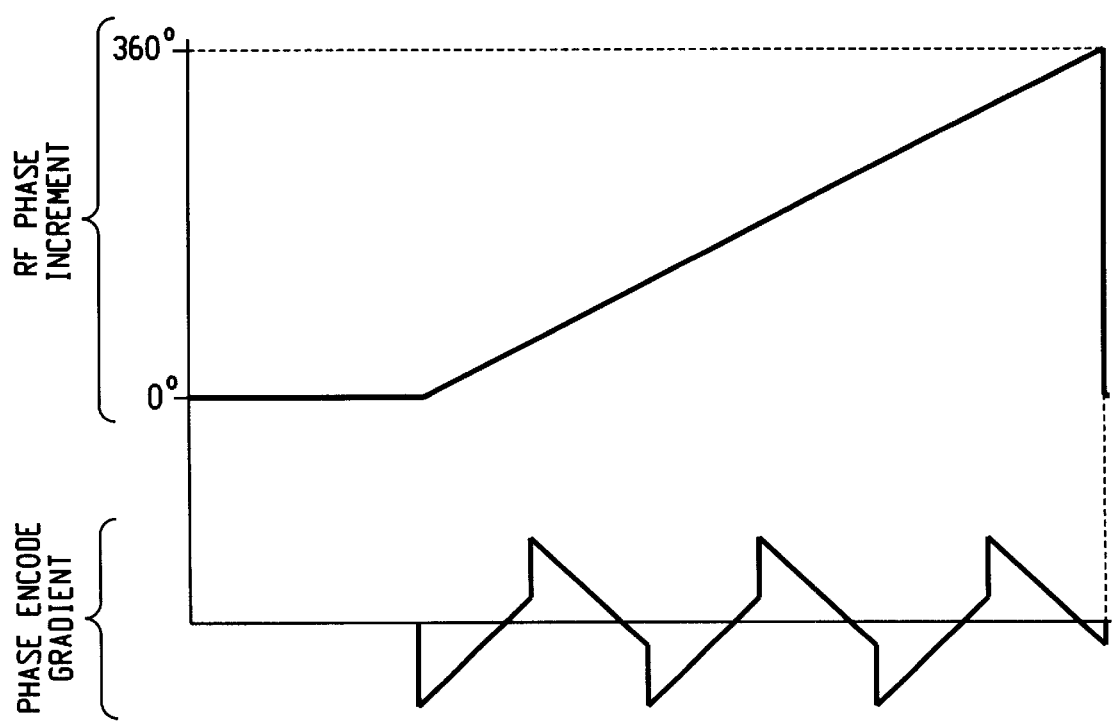

With reference to FIG. 5, in each phase-encode subcycle, the data lines spanning just over half of k-space are sampled. That is, the data lines near the center of k-space are sampled each time; but in alternate samplings, data is sampled from the central lines only to one side of k-space. Preferably, the data on each side of k-space are sampled alternately. In a second 360° of RF phase rotation, data collection is preferably offset by 360°/2N. Each portion (just over half) of the data lines of k-space is combined or averaged with the set of data lines from the opposite half of k-space collected at the closest RF phase angular offset, i.e., closest to 180° apart or closest to 0°, 360°, etc., apart. Appropriate filtering is used to correct for the redundancy of data at the center of k-space. If each data line is averaged with the closest other half leading and trailing data line, appropriate filtering is applied for proper weighting.

The half k-space data line collection scheme, like other collection schemes, can be formed at 90° intervals, 45° intervals, 60° intervals, or the like. For purposes of illustration, the embodiment of FIG. 5 is illustrated with the first 360° cycle of RF phase being collected at 60° intervals, i.e, 0°, 60°, 120°, 180°, 240°, and 300° and the second 360° cycle of the RF phase is collected at 30° offset 60° intervals, i.e., 30°, 90°, 150°, 210°, 270°, and 330°. In this manner, data collected at 12 angular increments is averaged for more complete artifact cancellation.

Rather than averaging the half k-space data sets, the remaining half can be completed by conjugate symmetry.

It is to be appreciated that the partial acquisition techniques described above can be used with the conventional, multiple spectral offset method as described in Zur, et al., "Motion Insensitive, Steady-State Free Precession Imaging", Mag. Res. Med. 16:444–459 (1990) rather than the preferred continuous spectral offset shifting. Further, the RF phase increment can change in a piecewise linear manner or a continuously varying manner. For example, the RF phase increment can change along a continuum adjacent the edges of k-space and plateau and remain constant for data lines taken near the center of k-space for improved matching and band cancellation. This piecewise linear RF phase increment change still eliminates the restabilization periods that would occur between stepped RF phase increments needed to acquire data at multiple spectral offsets.

Although this technique has been described with reference to two-dimensional imaging for simplicity of illustration, it is to be appreciated that it is equally applicable to three-dimensional imaging techniques.

In addition to slow modulation of the spatial offset frequency, the RF pulsing may also have a modulated irradiation with components at multiple spectral offsets, i.e., a "chirped" RF pulse train. In one embodiment, multiple trains of identical RF pulses are cycled each with its own phase shift incrementation scheme being applied to the subject in a synchronous fashion. As the RF pulses occur at exactly the same time, they can be combined as complex phasors to obtain a single RF pulse with a new amplitude and phase at each position in the steady-state free precession train. In this manner, more than one spectral frequency can be simultaneously irradiated. As the amplitude of the RF pulse train components are varied, there is effectively a superposition of complex excitation trains. A very large number of sequences can be generated from RF pulse trains formed by summing complex contributions of the form:

$$Ae^{i(\Omega n+p)}$$

where A is the amplitude that controls the relative strength of irradiation at a particular spectral frequency, I is the square root of −1, $\Omega$ is the phase increment used to cycle the $n^{th}$ pulse measured in radians. The parameter $\Omega$ sets the spectral offset of the pulse train relative to the main carrier. The parameter n is the index of the $n^{th}$ RF pulse in excitation trains n=1,2,3, . . . The parameter p is an overall phase shift applied to a component excitation train where $0 \leq p \leq 2\pi$ radians. Some sequences generated by this method can be reduced by the removal of unneeded slice selection gradients to being the equivalent of a basic steady-state free precession sequence with multiple sampling windows placed in the precession period. In some manifestations, some of the RF component amplitudes become zero.

A useful class of sequences can be obtained by restricting the amplitude factors A of the input trains to be equal, choosing the phase increments $\Omega$ to generate equally spaced bands at higher multiples of the periodicity set by the repeat time TR, in selecting the overall phase of each component of radiation so that the final combined amplitude numbers of each RF pulse in the train are equal.

The spectral offset modulation scheme generated by such a combination of conditions causes the instantaneous spectral offset with which each RF pulse is transmitted to vary cyclically through a finite set of values and creates a class of sequences that generates a periodically repeating cycle of steady-state signals, each of which has a different frequency-shifted spectral response pattern. During imaging, the signals generated for each cycle are each encoded with the same phase encode state and summed together. It will be appreciated that this converts the imaging operation from a serial averaging process into a sequential one.

The spectral responses formed in the multiple irradiation case are periodic in offset frequency, having a banding pattern in longitudinal and transverse magnetization. Conventional steady-state free precession has one irradiation frequency and generates two intense bands per cycle of spectral offset in its periodic response. Irradiation with two offset frequencies generates summed patterns with four less intense bands per cycle. Irradiation with three, four, etc. frequencies generates six, eight, etc. bands per cycle, respectively. The banding artifacts possess the characteristic of having two spectral periods, a major one (low spectral frequency) set by the choice of interpulse spacing, and a minor one (high spectral frequency) set by the number of irradiation frequencies in the RF pulse train.

With conventional balanced SSFP imaging, the interpulse spacing or repeat time TR is typically made shorter to minimize banding artifacts. However, when multiple spectral offsets are irradiated, increasing the repeat time TR facilitates the condition at which the bands due to the minor spectral response period are pushed to a size of less than one pixel and the band and non-band information within each pixel is averaged to provide a uniform image without banding. The effect of signal variation due to the major period of the spin system spectral response ensures that the local average over any minor period is never zero.

One feature of the technique with a large number of irradiation components is it exhibits an anomalous time-of-flight effect and that slow moving blood appears bright while fast moving blood appears black in imaging. Stated in more practical terms, the images have bright veins and dark arteries while the stationary tissue is an intermediary gray scale.

Better cancellation of band artifacts may be achieved with these sequences using a relatively small number of averages. In part, band artifacts are not as strong when multiple spectral offset irradiation is used. Also in part, the frequency of banding increases with the number of independent irradiation sequences. If the bands are so closely spaced that they fall within the natural resonance offset distribution within each imaging pixel, then the steady-state free precession banding artifacts disappear automatically. This effect is controlled by the choice of the repeat time. Increasing the repeat time TR will lower the band frequency spacing and lead to internal averaging within pixels. For four irradiation frequencies and a 5 millisecond repeat time, the bands are spaced 50 hertz apart, which is close to the value for obtaining internal pixel averaging in humans. The total imaging time for this sequence would be identical to that to obtain four averages with the conventional sequence.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a steady-state free precession magnetic resonance imaging sequence in which magnetic resonance is excited to establish a steady-state condition and a plurality of sets of data lines are collected with different spectral offsets, the improvement comprising:

changing the spectral offset of the sequence sufficiently slowly that the steady-state condition is reversibly modulated between the acquisition of each data line.

2. In the steady-state free precession method as set forth in claim 1, the improvement further comprising:

changing the spectral offset continuously.

3. In the steady-state free precession method as set forth in claim 1, the improvement further comprising:

changing the spectral offset piecewise continuously.

4. In the steady-state free precession method as set forth in claim 1, the improvement further comprising:

changing the spectral offset piecewise linearly.

5. In the steady-state free precession method as set forth in claim 1, wherein changing the spectral offsets includes:

shifting RF phase.

6. In the steady-state free precession method as set forth in claim 1 wherein changing the spectral offset includes:

shifting the RF frequency.

7. In the steady-state free precession method as set forth in claim 1 wherein changing the spectral offsets includes:

sweeping the magnetic field.

8. In a steady-state free precession magnetic resonance imaging sequence in which magnetic resonance is excited to establish a periodically modulated steady-state condition and in which a plurality of sets of data lines are collected, the improvement comprising:

exciting magnetic resonance with a radio frequency pulse train with at least three spectral offset components.

9. In the steady-state free precession method as set forth in claim 8, the improvement further comprising:

combining the periodically modulated steady-state signals generated by an integral number of periods of the RF excitation pulse train.

10. A steady-state free precession magnetic resonance imaging method comprising:

exciting magnetic resonance concurrently at a plurality of frequencies;

establishing a periodically modulated steady-state condition of magnetic resonance signals;

combining the periodically modulated steady-state signals generated by an integral number of periods of the RF excitation pulse train;

repeatedly sampling the combined resonance signal to generate a plurality of data lines;

reconstructing the data lines into an image representation.

11. A method of magnetic resonance imaging comprising:

placing a region of interest of a subject to be imaged in an examination region in a main magnetic field;

repeatedly exciting resonance with an RF pulse at regular repeat intervals;

after a steady-state condition of a magnetic resonance signal has been established, continuing to apply the RF pulses and applying at least phase-encode and read gradient pulses following each RF pulse to generate a set of data lines in k-space;

with the generation of each data line, changing a spectral offset to modulate the steady-state condition without destroying the steady-state condition;

combining the steady-state signals derived from a plurality of data lines.

12. The method as set forth in claim 11 wherein:

the spectral offset is changed sufficiently slowly that the steady-state condition is reversibly modulated between the acquisition of each data line.

13. The method as set forth in claim 11 wherein, in the repeatedly exciting step, the RF pulse train has at least two spectral offset components.

14. The method as set forth in claim 11 wherein the time integral of the magnetic gradients is zero over the sequence interpulse repeat interval.

15. The method as set forth in claim 11 further including:
combining corresponding data lines of a plurality of sets of data lines in k-space collected with different spectral offsets;
reconstructing the combined corresponding data lines into an image representation.

16. The method as set forth in claim 11 further including:
reconstructing each set of data lines into an image representation;
combining image representations generated with data lines collected with different spectral offsets.

17. The method as set forth in claim 11 wherein data lines near a center of k-space are sampled more often than data lines near an edge of k-space, over a plurality of sets of data lines.

18. The method as set forth in claim 17 wherein each set of data lines covers a central region of k-space and half of a remainder of k-space.

19. The method as set forth in claim 18 further includes:
generating data lines for the remaining half of k-space from complex conjugates of the data from the collected half of k-space.

20. The method as set forth in claim 18 further including:
combining sets of data lines which span one half of k-space with sets of data lines which span the other half of k-space but collected with different spectral offsets.

21. The method as set forth in claim 11 wherein in the repeatedly exciting step an RF phase increment is applied to successive RF pulses and varied over a range of 360° while N sets of data lines are collected, each set of data lines being collected with RF phase increments offset by 360°/N relative to adjoining sets of data lines.

22. The method as set forth in claim 21 wherein the RF phase increment changes continuously and linearly from commencement of collecting data lines of a first set of data lines after establishing steady-state free precession through collection of a last data line of a last set of data lines collected.

23. The method as set forth in claim 21 wherein RF pulses are applied to establish steady-state free precession over a duration at least the shortest nuclear relaxation time of material in the imaged region of interest of the subject.

24. The method as set forth in claim 21 wherein a full data line is collected between adjacent RF pulses and each data set includes at least four data lines.

25. An apparatus for generating magnetic resonance images comprising:
a main magnet for generating a main magnetic field through an examination region;
an RF transmitter for generating a plurality of RF pulses with a selected repeat time between pulses and a selected RF phase, the RF pulses inducing magnetic resonance which, with repeated applications of the RF pulses at a common repeat time, establishes steady-state free precession;
a receiver for receiving magnetic resonance signals in intervals between adjacent RF pulses after steady-state free precession has been established and demodulating the received magnetic resonance, the receiver having an adjustable RF phase;
a means for adjusting the RF transmitter and the RF receiver concurrently to adjust a spectral offset without disrupting an established steady-state of the magnetic resonance signals;
a combining means for combining steady-state signals derived from a plurality of data lines.

26. The apparatus as set forth in claim 25 wherein a plurality of sets of data lines are collected at different spectral offsets and further including:
a sorting means for sorting the data lines of each data set to match up like data lines from each data set;
a processor for Fourier transforming the combined data lines into an image representation.

27. The apparatus as set forth in claim 25 wherein the means for adjusting an RF phase of the transmitter and the receiver at least piecewise continuously.

28. The apparatus as set forth in claim 25 wherein each RF pulse train contains at least three spectral offset components.

29. In a steady-state free precession magnetic resonance imaging apparatus which, once a steady-state condition of the magnetic resonance is established, collects sets of data lines with different spectral offsets, the improvement comprising:
a means for changing the spectral offsets sufficiently slowly that the steady-state condition is reversibly modulated and anneals between the collection of the sets of data lines, whereby a need to wait for steady-state to be reestablished between each set of collected data lines is avoided.

* * * * *